US009155194B1

(12) United States Patent
Sullivan et al.

(10) Patent No.: US 9,155,194 B1
(45) Date of Patent: Oct. 6, 2015

(54) MEMORY INTERCONNECT ARRANGEMENT HAVING HIGH DATA TRANSFER SPEED SIGNAL INTEGRITY

(75) Inventors: Kenneth M. Sullivan, Hudson, MA (US); Adrianus Djohan, South Grafton, MA (US); Jonathan C. Giffen, Austin, TX (US); Lawrence J. Feroli, West Townsend, MA (US); John Phinney, Westford, MA (US); Kranti Uppala, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 399 days.

(21) Appl. No.: 13/535,529

(22) Filed: Jun. 28, 2012

(51) Int. Cl.
    H05K 7/20      (2006.01)
    H05K 1/11      (2006.01)
    H05K 1/14      (2006.01)

(52) U.S. Cl.
    CPC ... *H05K 1/11* (2013.01); *H05K 1/14* (2013.01)

(58) Field of Classification Search
    CPC ............ H01L 23/4093; H01L 23/4006; H01L 23/467; H01L 23/3677; G06F 1/20; H05K 1/0206; H05K 1/0203; H05K 1/144; H05K 1/141; H05K 3/0061; H05K 3/0058; H05K 5/0091; H05K 7/20545; H05K 7/12
    See application file for complete search history.

(56) References Cited

U.S. PATENT DOCUMENTS

| 4,907,977 | A  | * | 3/1990  | Porter ............................ 439/74 |
| 6,046,912 | A  | * | 4/2000  | Leman .......................... 361/784 |
| 6,147,871 | A  | * | 11/2000 | DeWitt et al. ................. 361/752 |
| 6,262,890 | B1 | * | 7/2001  | Dhawan et al. ............... 361/690 |
| 6,362,974 | B1 | * | 3/2002  | Lettang ......................... 361/790 |
| 6,711,021 | B1 | * | 3/2004  | Morris ......................... 361/721 |
| 6,731,515 | B2 | * | 5/2004  | Rhoads ......................... 361/796 |
| 7,023,701 | B2 | * | 4/2006  | Stocken et al. .............. 361/704 |
| 7,257,002 | B2 | * | 8/2007  | Nagahashi .................... 361/704 |
| 7,365,990 | B2 | * | 4/2008  | RaghuRam .................. 361/720 |
| 7,474,529 | B2 | * | 1/2009  | Tian et al. .................... 361/704 |
| 7,480,147 | B2 | * | 1/2009  | Hoss et al. ................... 361/721 |
| 7,619,893 | B1 | * | 11/2009 | Yu ................................. 361/715 |
| 7,715,200 | B2 | * | 5/2010  | Cho et al. ..................... 361/749 |
| 7,929,307 | B2 | * | 4/2011  | Hsieh ........................... 361/707 |
| 7,933,125 | B2 | * | 4/2011  | Wei et al. ..................... 361/699 |
| 8,009,420 | B1 | * | 8/2011  | Hill et al. ................. 361/679.54 |
| 8,277,229 | B2 | * | 10/2012 | Chiu et al. ..................... 439/65 |
| 8,385,069 | B2 | * | 2/2013  | Iyengar et al. ............... 361/700 |
| 8,730,670 | B1 | * | 5/2014  | Zohni et al. .................. 361/690 |
| 2002/0034068 | A1 | * | 3/2002 | Weber et al. ................. 361/790 |
| 2002/0038405 | A1 | * | 3/2002 | Leddige et al. .............. 711/115 |
| 2003/0126338 | A1 | * | 7/2003 | Dodd et al. ................... 710/305 |

(Continued)

*Primary Examiner* — Hoa C Nguyen
*Assistant Examiner* — Xanthia C Cunningham
(74) *Attorney, Agent, or Firm* — Krishnendu Gupta; Konrad R. Lee

(57) ABSTRACT

An arrangement having a processor electrically to, and mounted on, a portion of a surface of a motherboard. A plurality of memory cards is plugged into memory board slot type connectors on a surface of the memory card printed circuit board with the surface of the memory card printed circuit board being perpendicular to the surface of the motherboard. A right angle backplane connector has a first end disposed perpendicular to, and electrically connected to the surface of a motherboard and a second end disposed on the surface of, and electrically connected to, the memory card printed circuit board. The plurality of memory cards is parallel to the surface of the motherboard. An ejector mechanism is provided for removing the memory printed circuit board from an electrical connector receptacle mounted to the motherboard by camming action.

9 Claims, 15 Drawing Sheets

(56) References Cited

U.S. PATENT DOCUMENTS

| | | | |
|---|---|---|---|
| 2006/0187646 A1* | 8/2006 | Belson et al. | 361/719 |
| 2006/0221573 A1* | 10/2006 | Li | 361/704 |
| 2007/0285895 A1* | 12/2007 | Gruendler et al. | 361/711 |
| 2010/0009571 A1* | 1/2010 | Scherer et al. | 439/607.05 |
| 2010/0049893 A1* | 2/2010 | Drako | 710/301 |
| 2010/0144203 A1* | 6/2010 | Glover et al. | 439/607.07 |
| 2010/0323536 A1* | 12/2010 | Crane et al. | 439/62 |
| 2012/0302096 A1* | 11/2012 | Ellison | 439/607.05 |

\* cited by examiner

MEMORY INTERCONNECT ARRANGEMENT HAVING HIGH DATA TRANSFER SPEED SIGNAL INTEGRITY

TECHNICAL FIELD

This disclosure relates generally to memory interconnect arrangements and more particularly to memory interconnect arrangement having high data transfer speed signal integrity

BACKGROUND

As is known in the art, in many computer applications a chassis houses Central Processor Units (CPUs) and memory boards (i.e., memory cards) electrically interconnected through a motherboard. In one layout, each CPU is disposed on and electrically connected to the motherboard and the memory cards are vertically inserted into slot connectors disposed on and electrically connected to the motherboard. With such an arrangement, routing limitations and board real estate in rack width form factor does not, in some applications, leave sufficient room to attach multiple DIMMs per channel with quad socket (BGA 2011 pin) implementation.

In order to reduce the surface space occupied by the CPUs and memory cards, in one arrangement, a vertically extending memory board printed circuit board is plugged into an edge card connector that is mounted to the motherboard. The vertically extending memory board printed circuit board is positioned adjacent to one side of the CPU. The memory cards are then plugged into the memory card printed circuit board in a vertical stacked arrangement; i.e., one memory card above another memory card and facing away from the region occupied by the CPU. The use of an edge connector however does not provide the requisite data transfer speed and signal integrity in many applications as for example where transfers in the order of 1866 mega transfers per second are required between the memory and CPU.

SUMMARY

In accordance with the present disclosure, an arrangement is provided having: a motherboard; a processor electrically to, and mounted on, a portion of a surface of the motherboard; a memory card printed circuit board; a plurality of memory cards is plugged into memory board slot type connectors on a surface of the memory card printed circuit board with the surface of the memory card printed circuit board being perpendicular to the surface of the motherboard; and a right angle backplane connector having: a first end disposed perpendicular to, and electrically connected to the surface of a motherboard and a second end disposed on the surface of, and electrically connected to, the memory card printed circuit board.

With such an arrangement, two DIMMs per channel may be fit into a BGA 2011 quad socket server motherboard. More particularly, with such an arrangement, it is possible to physically fit 32 DIMM slots per motherboard; use the full height of DDR3 DIMMs; use shorter trace length and thereby improved signal integrity; use shorter connector length and thereby improved signal integrity; fit 32 DIMM sockets and 4 BGA2011 CPU sockets in a 2U tall rack space; use full height industry standard DDR3 memory modules; and maximize signal integrity by tuning wafer in right angle connector for single ended performance. In one embodiment, the arrangement includes: a motherboard; a processor electrically to, and mounted on, a portion of a surface of the motherboard; a memory card printed circuit board;

a plurality of memory board slot type connectors arranged in rows and mounted on, and electrically connected to, a surface of the memory card printed circuit board; a plurality of memory cards, each one being plugged into a corresponding one of the plurality of memory board slot type connectors; a right angle backplane connector having: a first end disposed perpendicular to the surface of the motherboard, the first end being electrically to, and mounted vertically on, a different portion of a surface of the motherboard; and a second end, disposed at a right angles to the first end and disposed on the surface of, and electrically connected to, the memory card printed circuit board; wherein the surface of the memory card printed circuit board is perpendicular to the surface of the motherboard and the plurality of memory cards is parallel to the surface of the motherboard.

In one embodiment, portions of the plurality of memory cards are suspended by the memory card printed circuit board over portions of the processor.

In one embodiment, the arrangement includes: a second a memory card printed circuit board and a second plurality of memory board slot type connectors arranged in rows and mounted on, and electrically connected to, a surface of the second memory card printed circuit board. A second plurality of memory cards is provided, each one being plugged into a corresponding one of the second plurality of memory board slot type connectors. A second right angle backplane connector is provided having: a first end disposed perpendicular to the surface of the motherboard, the first end being electrically to, and mounted vertically on, a second different portion of a surface of the motherboard; and a second end, disposed at a right angles to the first end of the second right angle backplane connector and disposed on the surface of, and electrically connected to, the memory card printed circuit board. The surface of the second memory card printed circuit board is perpendicular to the surface of the motherboard and the plurality of memory cards is parallel to the surface of the motherboard. The first-mention memory card printed circuit board and the second the memory card printed circuit board are on opposite sides on the CPU.

In one embodiment, the second plurality of memory cards are suspended by the second memory card printed circuit board over portions of the processor.

In one embodiment, the first-mention memory card printed circuit board and the second the memory card printed circuit board are on opposite sides on the CPU.

In one embodiment, the first-mention memory cards have distal ends projecting towards distal ends of the second memory cards.

In one embodiment, a heat sink is provided having a base portion disposed over the CPU and having a vertical portion disposed between the distal ends of the first-mention memory card and the distal ends of the second memory cards.

In one embodiment, the right angle backplane connector comprises: electrical wires connected to the memory cards through the memory card printed circuit board and the plurality of memory board slot type connectors, each one being plugged into a corresponding one of the plurality of memory board slot type connectors; and ground plane plates disposed between the wires.

In one embodiment, an ejector mechanism is provided for removing a printed circuit board plugged into an electrical connector from an electrical connector receptacle mounted to a motherboard. The ejector mechanism includes: a pair of cams having: a pair of arms connected to pivot points on at opposite ends of side portions of the printed circuit board; distal end of each of the arms being formed with a camming structure having surface for engaging the motherboard to remove the memory card printed circuit board from the motherboard mounted connector receptacle; and proximal ends of the arms being formed with a tab-like portion shaped to engage the thumb or finger of a person manually operating the ejector mechanism to spread the arms in opposite rotary directions forcing the surface of the camming structure against the motherboard to vertically lift the printed circuit from then electrical connector receptacle mounted to a motherboard.

In one embodiment, the length of the arm between the tab-like portion and the pivot point is longer than the length of the arm between the pivot point and the camming surface.

In one embodiment, the pair of cams is mounted to a back side of the printed circuit board and a plurality of memory cards are mounted to, and project outwardly from, a front surface of the printed circuit board.

In one embodiment, a coil spring is affixed at one end to the camming surface structure and having an outer end inserted into a slot formed in the edge of the printed circuit boards for urging the arms of away from one another to enable manual insertion of the printed circuit board into the motherboard mounted connector receptacle.

In one embodiment, a horizontally extending bar is affixed at its end to the back side of printed circuit board, the intermediate portion of the bar being spaced from the back side of the memory card, the upper portion of the bar having at least one projection a vertical surface to provide an aid in indicating when the printed circuit board is fully inserted into the connector receptacle.

In one embodiment, at least one of the arms has a position indicia positioned to be hidden by the vertical surface of the projection on the bar when the printed circuit board is fully engaged in the motherboard mounted connector receptacle In one embodiment, a connector receptacle disposed on the motherboard has a column of signal pins separated by a column of ground pins. The signal pins in one of the columns have a first signal pin disposed between a second signal pin and a third signal pin. The motherboard routes the signal pins to the CPU through conductors connected to the signal pins. Portions of the conductors connected to the second signal pin and to the third pin are deposed adjacent one another on one side of the column of ground pins and the conductor connected to the first pin is on the other side of the column of ground pins.

In one embodiment, the connector receptacle disposed on the motherboard has a column having a pair strobe pins; the column of the pair of strobe pins being separated from the column of signal pins by a second column of ground pins; wherein the motherboard routes the pair of strobe pins to the CPU through strobe pin conductors connected to the strobe pins, the pair of strobe pin conductors being disposed on the same side of the second column of ground pins.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 6A' is a front view of the memory card printed circuit board of FIG. 2 plugged into the motherboard in accordance with the disclosure;

FIG. 7A showing the mechanism in a position with the memory card printed circuit board of FIG. 2 not fully plugged into the motherboard and FIG. 7B showing the mechanism in a position with the memory card printed circuit board of FIG. 2 fully plugged into the motherboard in accordance with the disclosure;

Like reference symbols in the various drawings indicate like elements.

DETAILED DESCRIPTION

Figure 1:
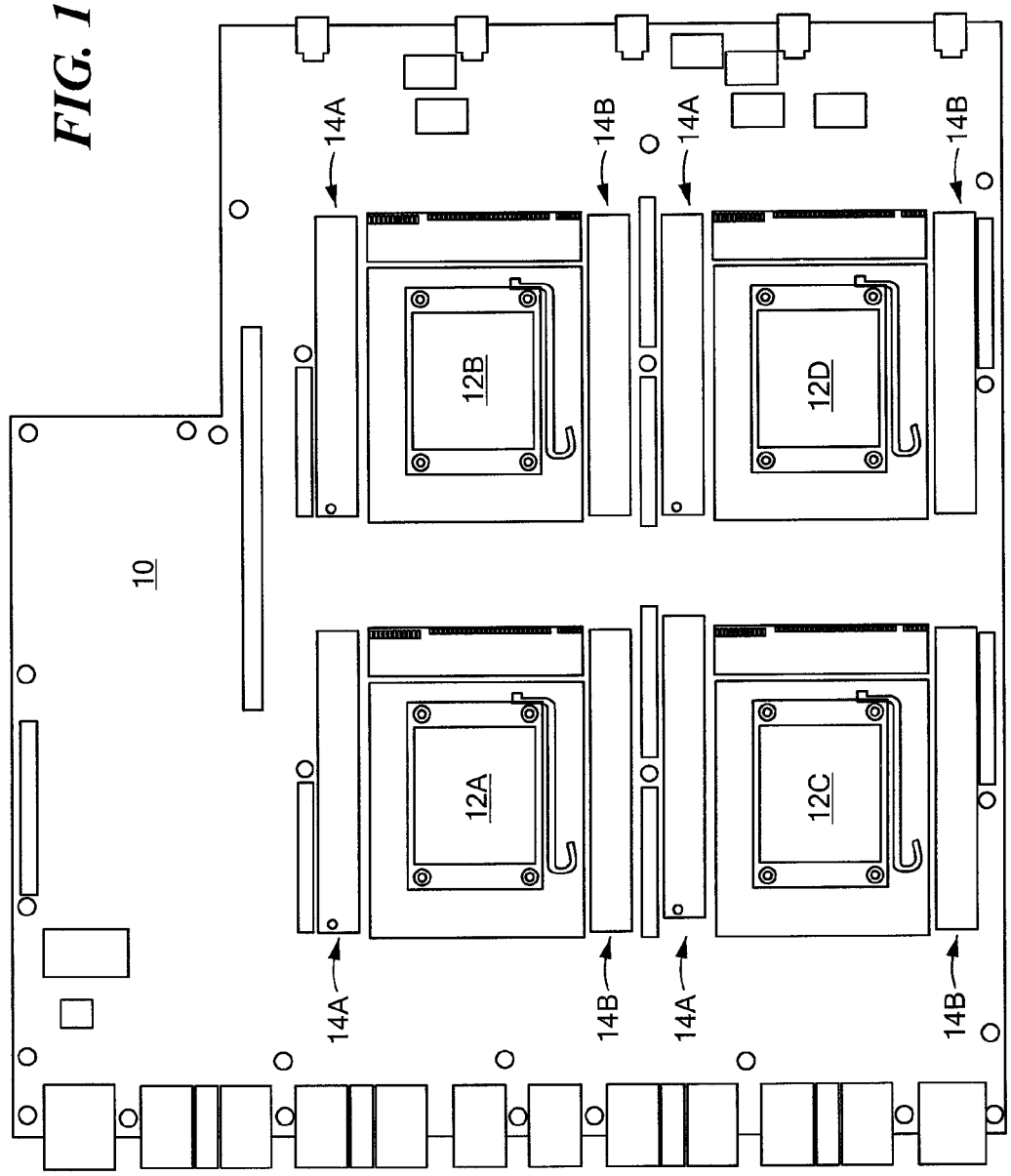
FIG. 1 is a top view of a motherboard having a plurality of CPUs and right angle backplane connector receptacles arranged in accordance with the disclosure.
Figure 2:
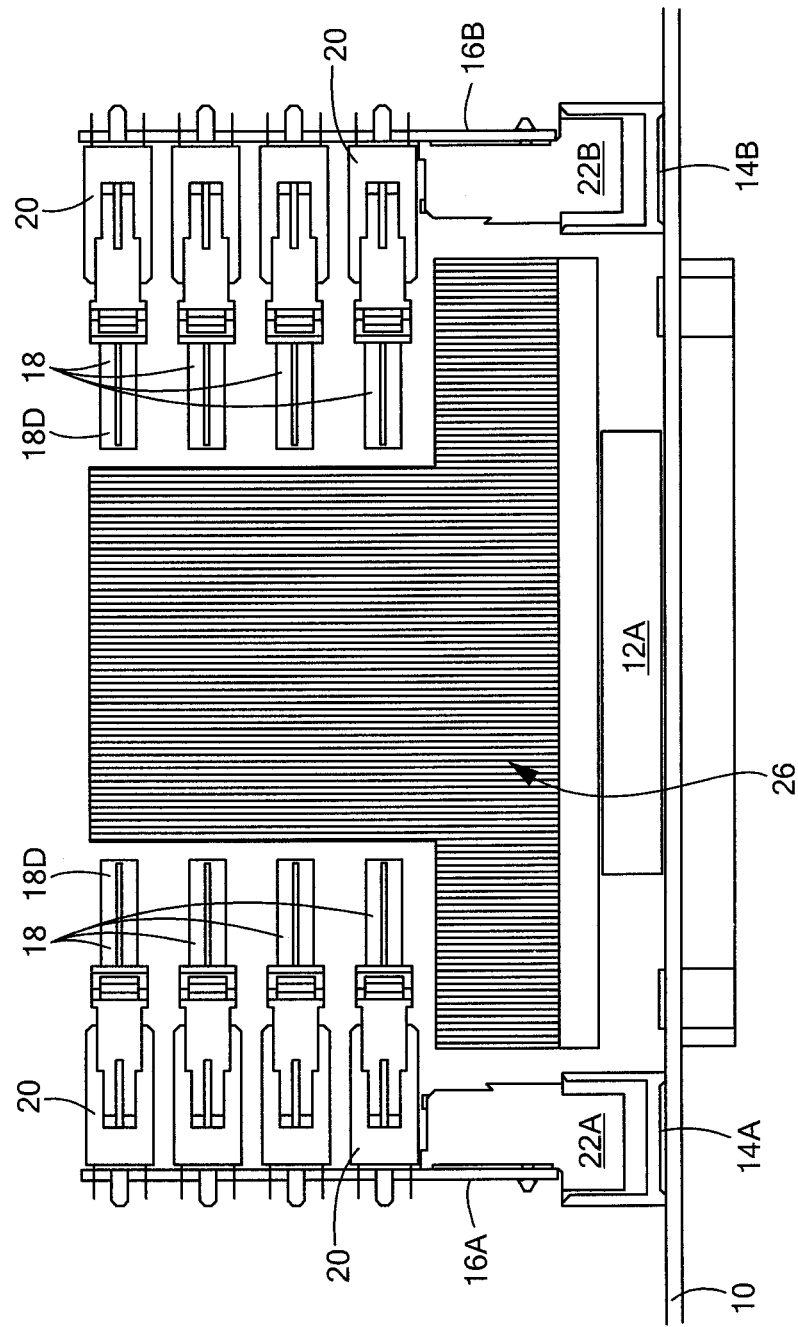
FIG. 2 is a side elevation view of an exemplary of the CPUS of FIG. 1 together with a heat sink and memory boards plugged into a memory card printed circuit board and arranged in accordance with the disclosure.
Figure 3:
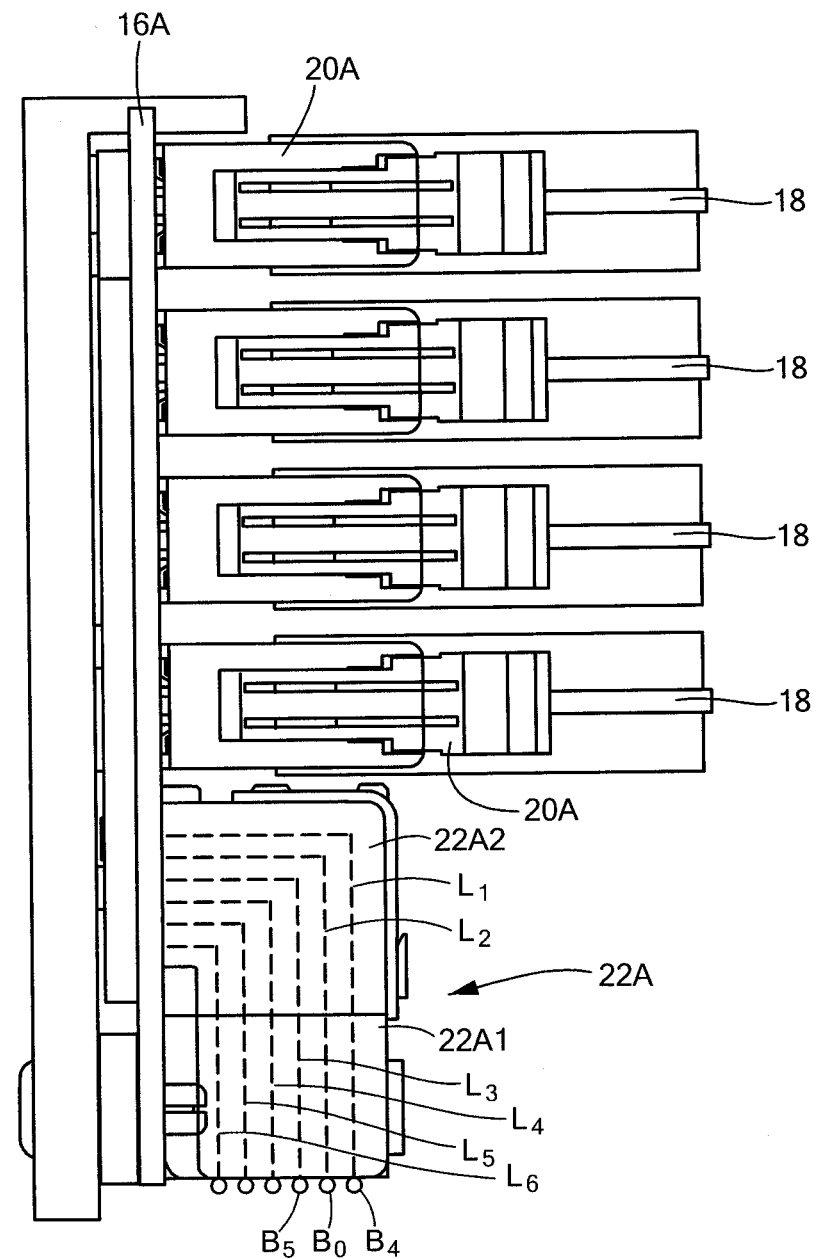
FIG. 3 is a side view of the plurality of memory cards of FIG. 2 plugged into memory board slot type connectors on a front surface of the memory card printed circuit boards of FIG. 2 in accordance with the disclosure.
Figure 4:
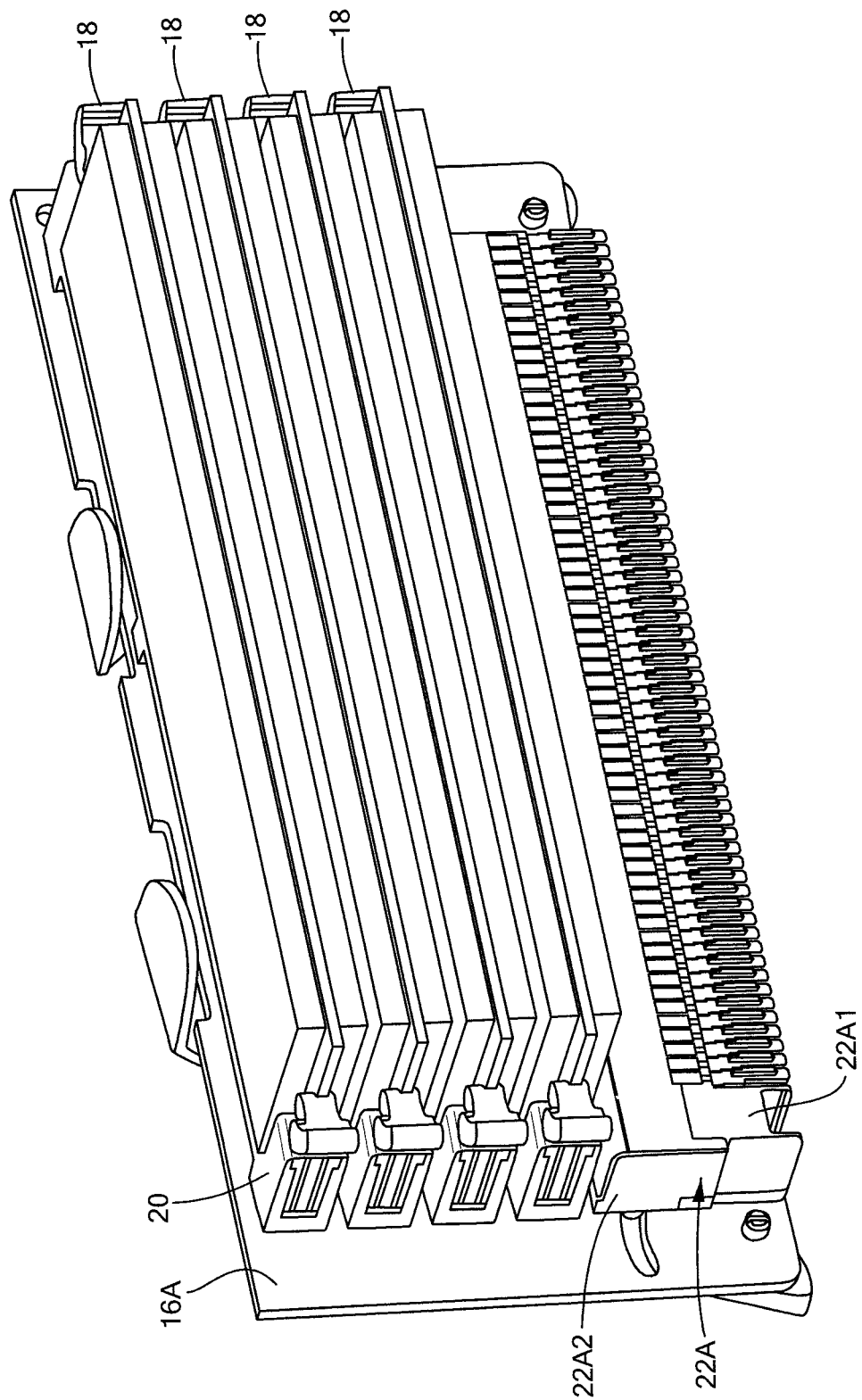
FIG. 4 is a perspective view of the plurality of memory cards of FIG. 2 plugged into memory board slot type connectors on a front surface of the memory card printed circuit boards of FIG. 2 in accordance with the disclosure.

Referring now to FIGS. 1 and 2, a motherboard 10 is shown having a plurality of, here four CPUs, 12A, 12A, 12C and 12D electrically arranged in a 2×2 array connected to the motherboard 10. On opposite sides of each one of the CPUs 12A, 12A, 12C and 12D is a right angle backplane connector receptacle 14A, 14B, respectively. As shown in FIG. 2 for an exemplary one of the four CPUs, 12A, 12A, 12C and 12D, here for example, CPU 12A, a pair of vertically extending memory card printed circuit boards 16A, 16B is plugged into a corresponding one of the right angle backplane connector receptacle 14A, 14B, respectively. A plurality of memory cards 18 is plugged into memory board slot type connectors 20 on a front surface of each one of the memory card printed circuit boards 16A, 16B. The memory card printed circuit boards 16A, 16B are being perpendicular to the surface of the motherboard 10. It is also noted that a pair of right angle backplane connectors 22A, 22B (an exemplary one, here connector 22A is provided, each one of right angle backplane connectors 22A, 22B having: a first end 22A1 (FIGS. 3 and 4)

disposed perpendicular to, and electrically connected to the surface of the motherboard 10 through the right angle backplane connector receptacle 14A, 14B, respectively, and a second end 22A2 disposed on the surface of, and electrically connected to, the memory card printed circuit board 16A, 16B, respectively. An example of one column of the electrical wires in the exemplary one of the the electrical connectors 22A being represented in FIG. 3 by dotted lines $L_1$-$L_6$. It is noted that the signal propagation delay time difference between the wires $L_1$-$L_6$ is designed to be minimized More particularly, the plurality of memory board slot type connectors 20 are arranged in rows (FIG. 4) and are mounted on, and electrically connected to, surfaces of the pair of memory card printed circuit boards 16A, 16B. The plurality of memory cards 18 have proximal ends plugged into a corresponding one of the plurality of memory board slot type connectors 20. The right angle backplane connectors 22A, 22B have: first end disposed perpendicular to the surface of the motherboard 10, the first end being electrically to, and mounted vertically on, a different portion of a surface of the motherboard through right angle backplane connector receptacle 14A, 14B; and a second end, disposed at a right angles to the first end and disposed on the surface of, and electrically connected to, the memory card printed circuit boards 16A, 16B, respectively, with the surfaces of the memory card printed circuit board being perpendicular 16A, 16B to the surface of the motherboard 10 and the plurality of memory cards 18 is parallel to the surface of the motherboard 10.

It is noted in FIG. 2 that portions of the plurality of memory cards 18 are suspended by the memory card printed circuit boards 16A, 16B over portions of the CPUs as shown for exemplary CPU 12A in FIG. 2. It is also noted that the distal ends 18D (FIG. 2) of the memory cards 18 on one side of the CPU 12A project towards distal ends 18D of the memory cards 18 on the opposite side of the CPU 12A.

Figure 5:
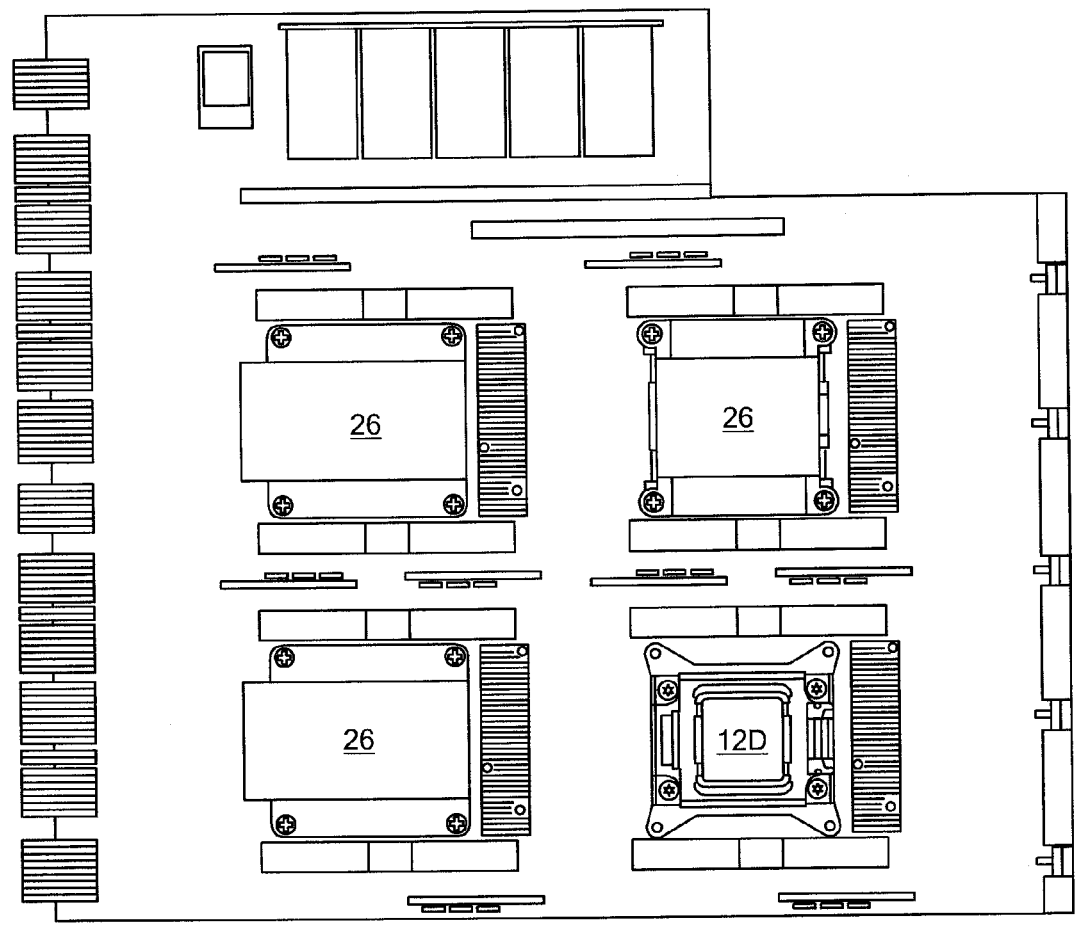
FIG. 5 is a top view of a motherboard having a plurality of the CPUs and right angle backplane connector receptacles of FIG. 1 together with the heat sink arranged in accordance with the disclosure.

A heat sink 26 (FIG. 2) is provided for each one of the CPUs 12A-12D. Each heat sink 26 has a base portion disposed on the CPU 12A-12D and a vertical portion disposed between the distal ends 18D of the memory cards 18 on the opposite sides of the CPUs 12A-12D as shown in FIG. 5 for CPUs 12A-12C; the heat sink 26 for CPU 12D being removed in FIG. 5 for illustration.

Each one of the right angle backplane connectors 22A-22D is identical and is here part no. AV600-00158 VHDM-M daughter card assembly 6 row connector, manufacture by Amphenol TCS, a Division of Amphenol Corporation, 200 Innovative Way, Nashua, N.H. 03062 and includes: electrical wires connected to the memory cards through the memory card printed circuit board and the plurality of memory board slot type connectors, each one being plugged into a corresponding one of the plurality of memory board slot type connectors; and ground plane plates, not shown, disposed between the wires.

Figure 6:
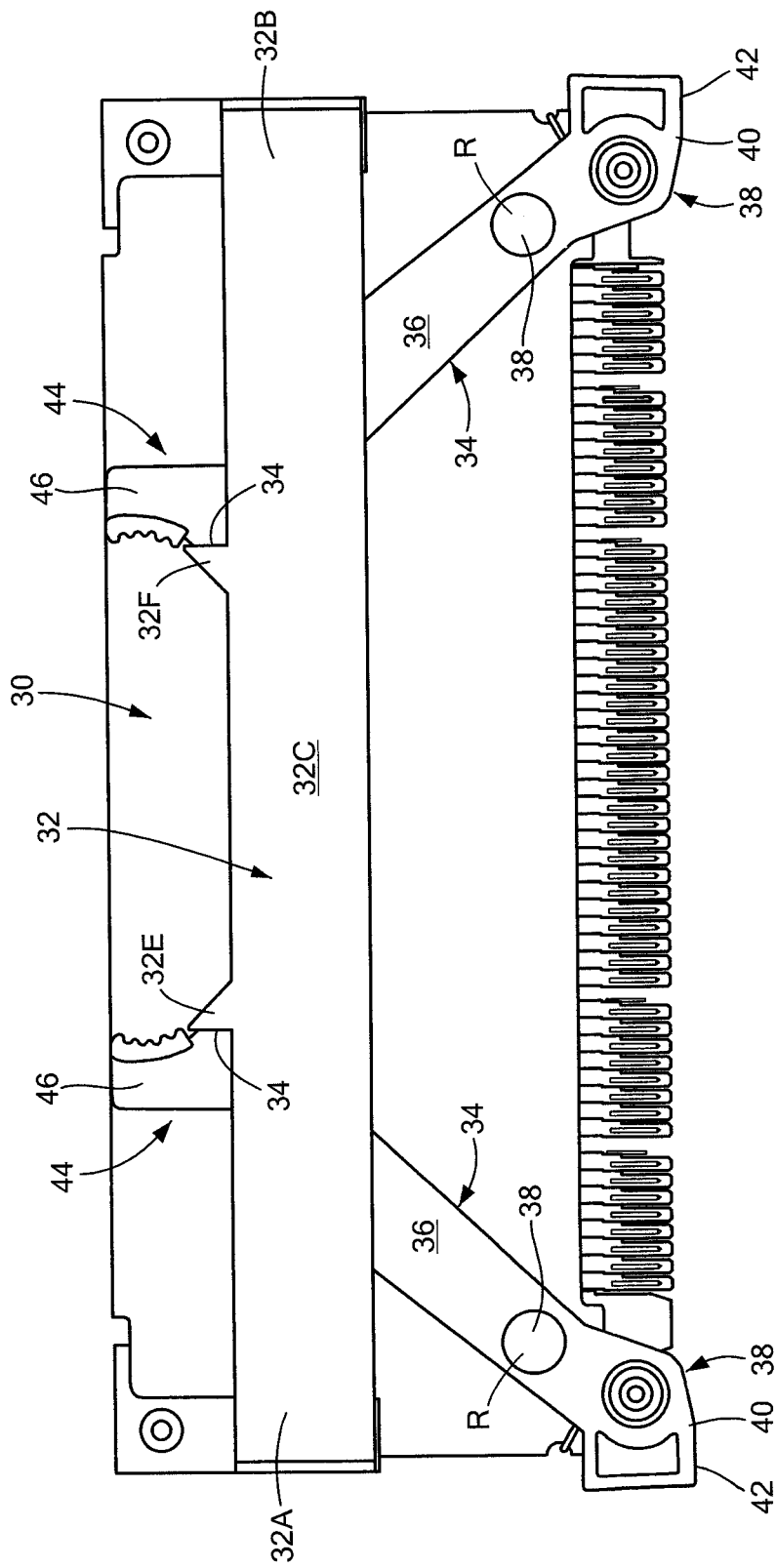
FIG. 6 is a rear view of the memory card printed circuit board of FIG. 2 in accordance with the disclosure.

Referring now to FIG. 6, an exemplary one of the pair of vertically extending memory card printed circuit boards 16A, 16B, here board 16A, is shown in more detail to have an injector/ejector mechanism 30 mounted to the back side of the memory card printed circuit board 16A. The injector/ejector mechanism 30 is used to: assist in the manual insertion of the memory card printed circuit board 16A into the right angle backplane connector receptacle 14A (FIG. 1); ensure that the memory card printed circuit board 16A is fully inserted in the backplane right angle connector receptacle 14A; and, to assist in subsequent removal the memory card printed circuit board 16A from the backplane right angle connector receptacle 14A.

The injector/ejector mechanism 30 includes a horizontally extending bar 32 (FIG. 6) affixed at its end 32A. 32B, to the back side of the memory card printed circuit board 16A. The intermediate portion 32C of the bar 70 is spaced from the back side of the memory card printed circuit board 16A. The upper portion of the bar 32 is provided with a pair of triangular shaped projections 32E and 32F having a one leg thereof with a vertical surface 34 to provide, in a manner to be described, an aid in indicating when the memory card printed circuit board 16A is fully inserted into the motherboard mounted right angle backplane connector receptacle 14A.

The injector/ejector mechanism 30 also includes a pair of cams 34 having arms 36 connected to pivot points 38 on opposite ends of the back side of the memory card printed circuit board 16A. The pivot action is provided by a rivet R passing through a slightly larger aperture that passes through the memory card printed circuit board 16A. The arms 36 are disposed in the space between the intermediate portion 32C of the horizontally extending bar 32 and the back surface of the memory card printed circuit board 16A. The distal end 38 of each of the arms 36 is formed with a camming structure 40 having surface 42 for engaging the motherboard 10 (FIG. 1) to remove the memory card printed circuit board 16A from the motherboard mounted right angle backplane connector receptacle 14A in a manner to be described. The proximal ends 44 of the arms 36 are formed with a knurled tab-like portion 46 shaped to engage the thumb or finger of a person (not shown) manually operating the injector/ejector mechanism 30 to spread the arms 36 in opposite rotatory directions about the pivot points 38 forcing the surface 42 of the camming structure 40 against the upper surface of the motherboard to vertically lift the printed circuit from then electrical connector receptacle 16A mounted to the motherboard.

It is noted that the length of the arm 36 between the tab-like portion 46 and the pivot point 38 is longer than the length of the arm 36 between the pivot point 38 and the camming surface 42 to provide mechanical advantage in removing the memory card printed circuit boards 16A from the right angle backplane connector receptacle 14A attached to the motherboard.

Figure 6A:
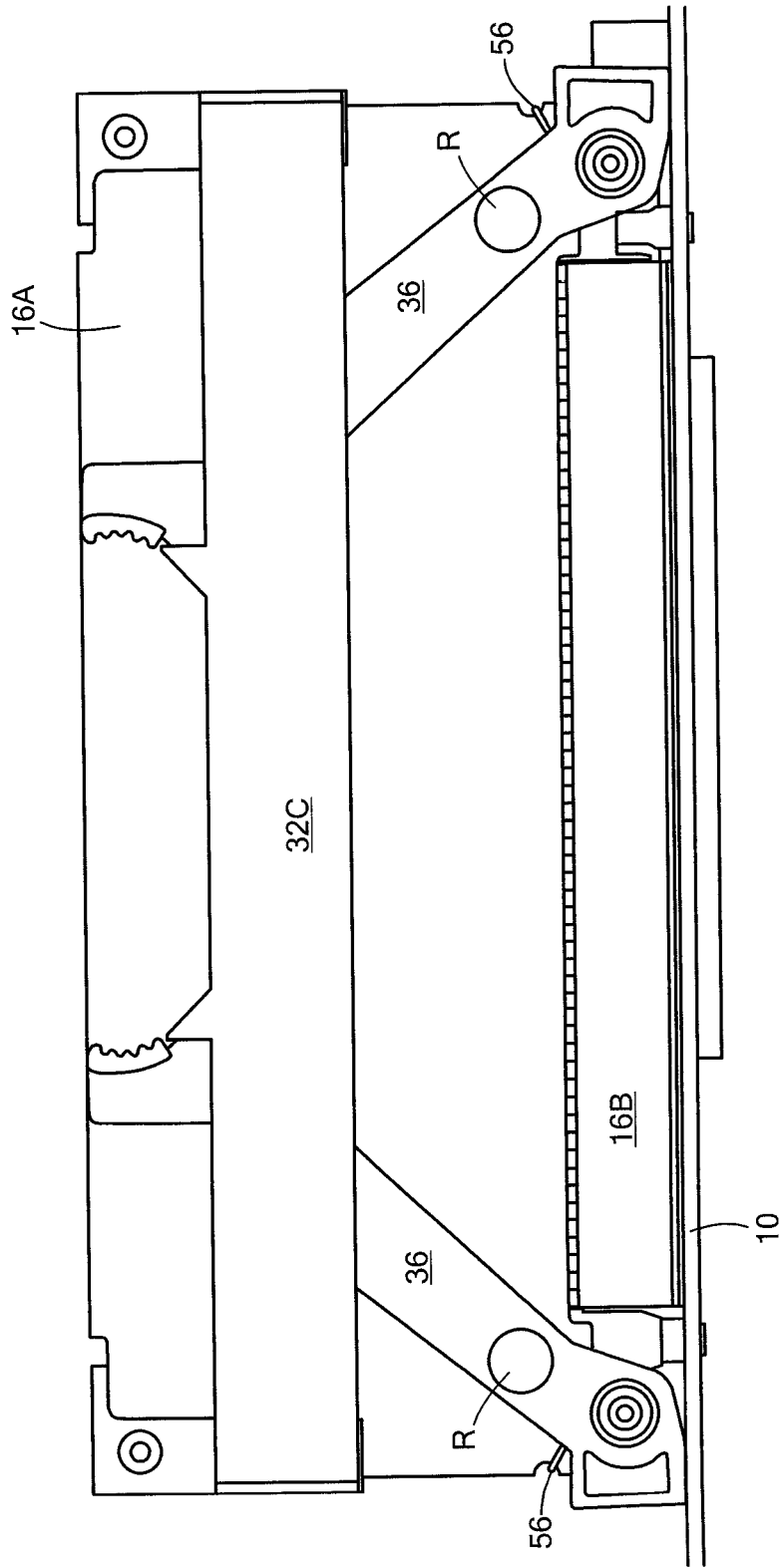
FIG. 6A is a rear view of the memory card printed circuit board of FIG. 2 plugged into the motherboard in accordance with the disclosure.
Figure 6A:
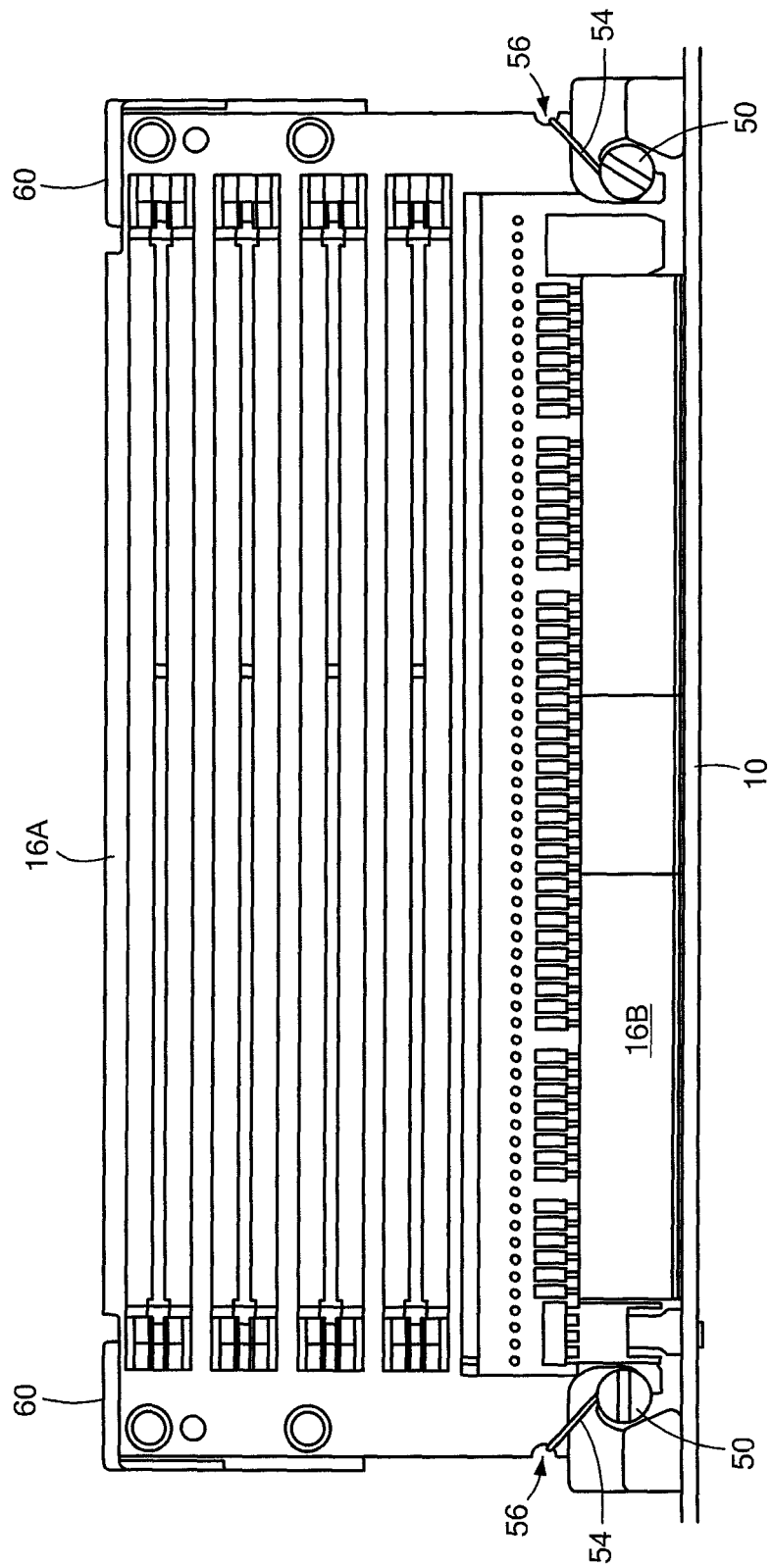
Figure 7:
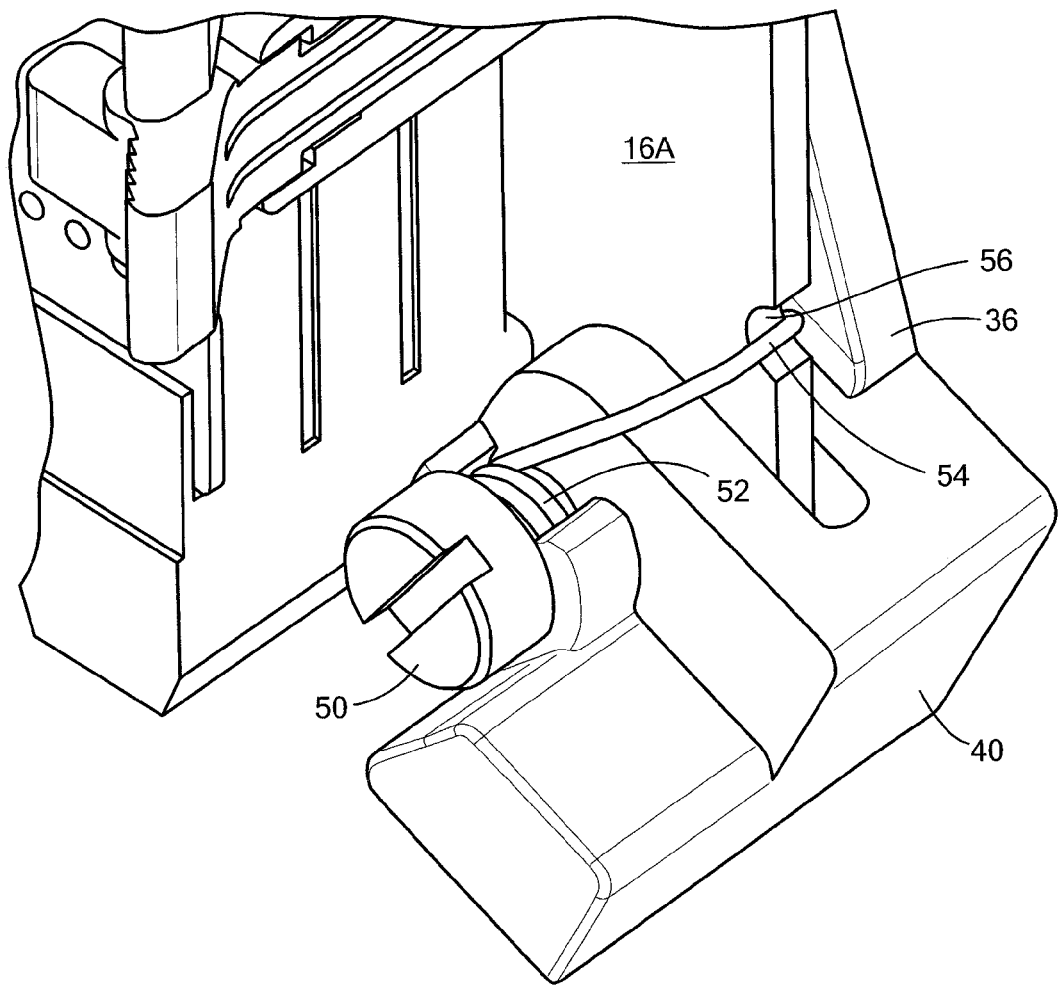
FIG. 7 is a perspective view of a portion of an injector/ejector mechanism used to indicate insertion and remove the memory card printed circuit board of FIG. 2 to and from the motherboard in accordance with the disclosure.
Figure 7A:
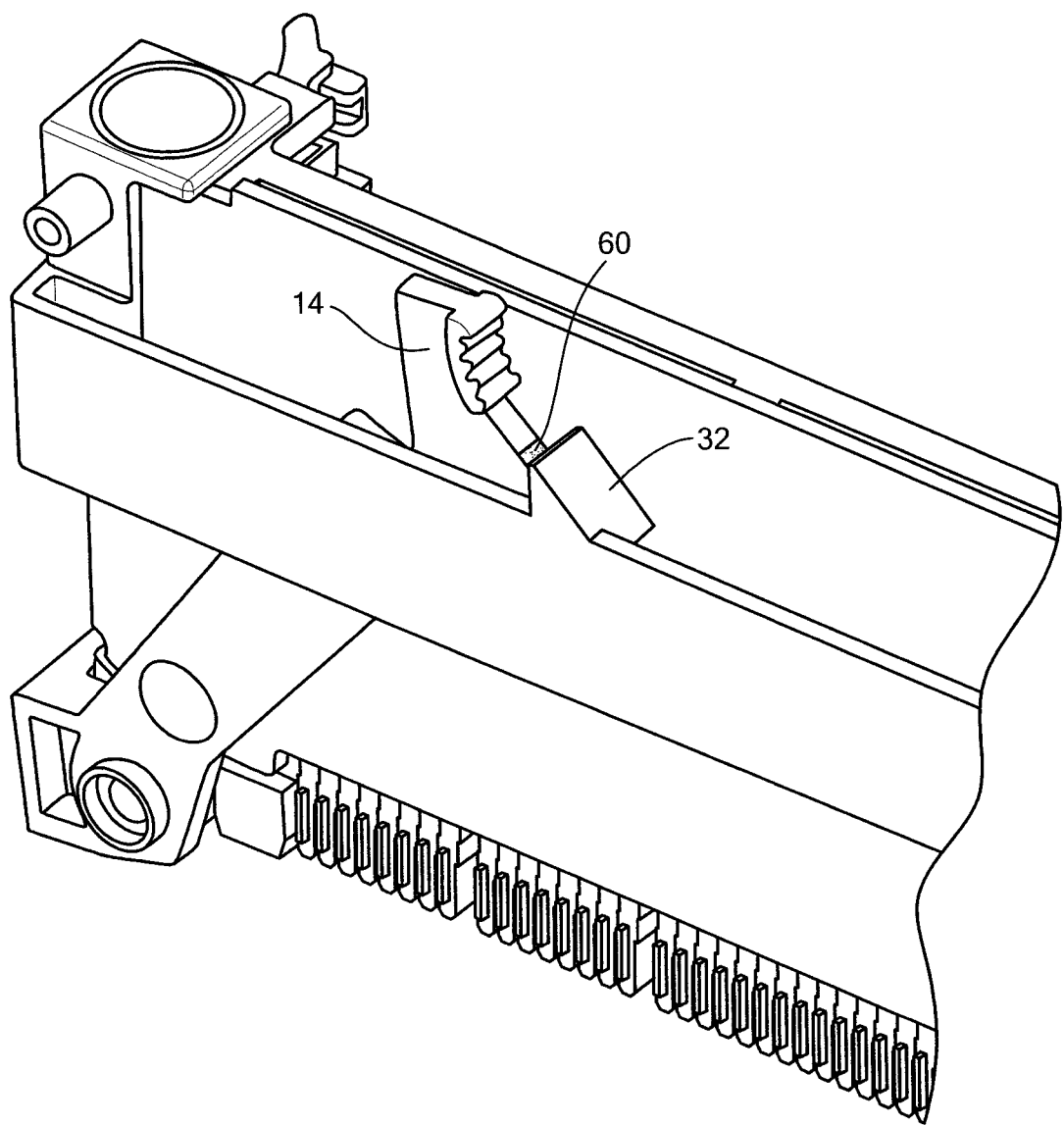
FIGS. 7A and 7B are perspective view of a different portion of the injector/ejector mechanism.

Referring to FIGS. 7 and 7A through 7C, affixed to the camming surface structure 40 by a shoulder screw 50 is a coil spring 52 having its outer end 54 inserted into a slot 56 formed in the edge of the memory card printed circuit board 16A (see also FIGS. 6A and 7A'). The spring 52 urges the arms 36 of the injector/ejector mechanism 30 into the closed position (i.e., away from one another) as shown in FIGS. 6A and 6A' to enable manual insertion of the memory card printed circuit board 16A into the motherboard mounted right angle connector receptacle 14A, as shown in FIGS. 6A and 6A' by manually pressing at points 60 (FIG. 6A').

Figure 7B:
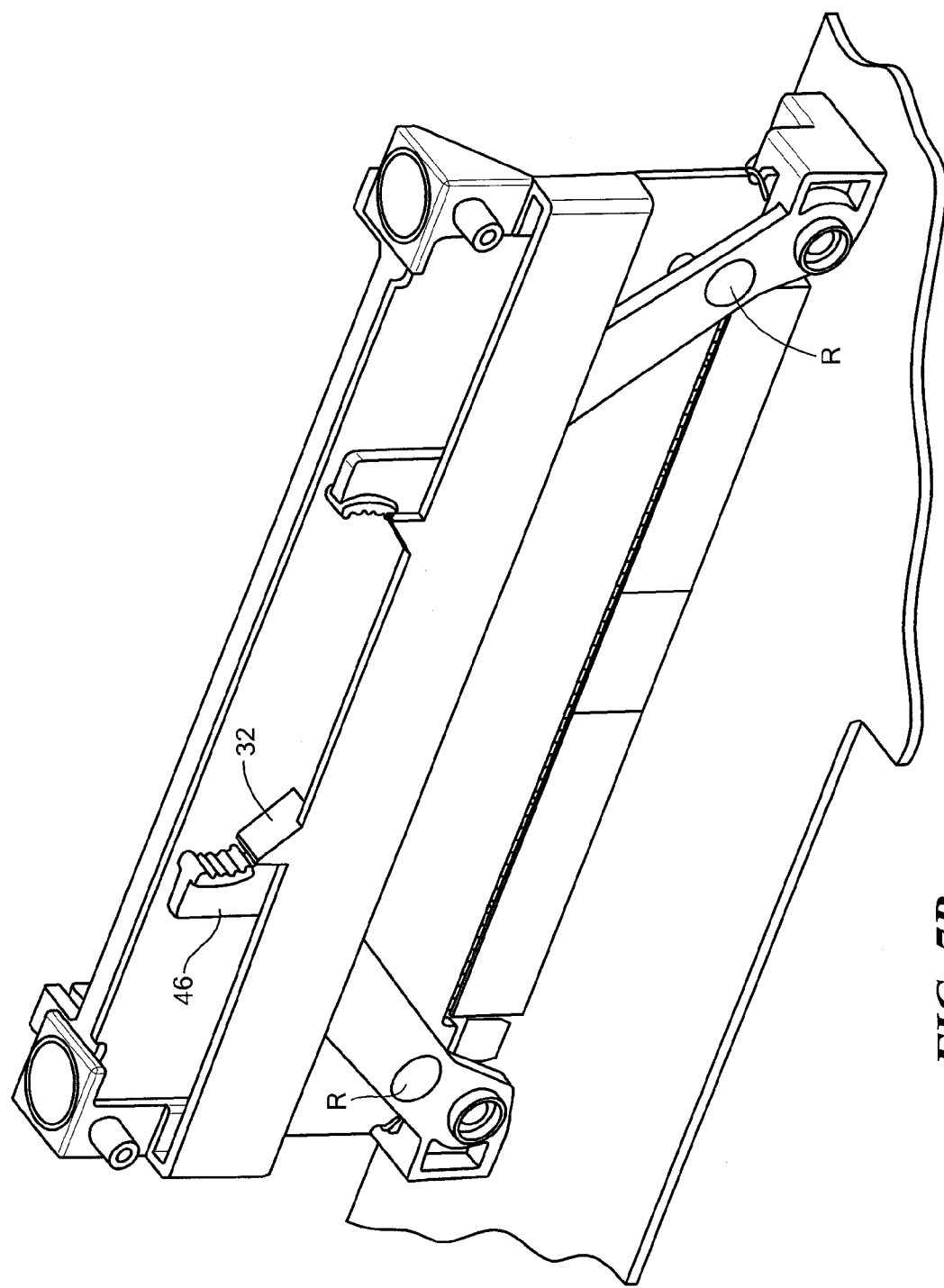
Figure 7C:
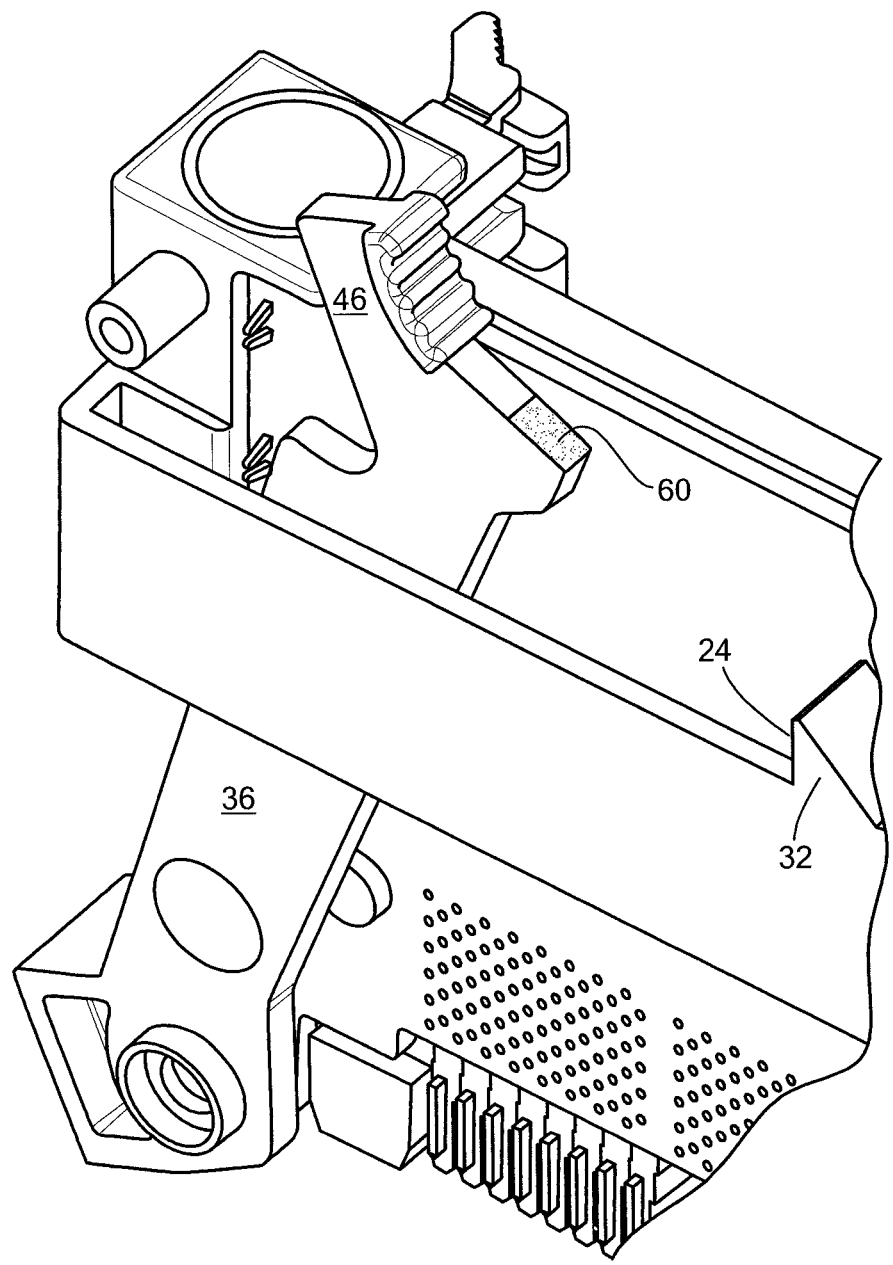
FIG. 7C is a perspective view of a still different portion of the injector/ejector mechanism; of FIGS. 7A and 7B.

Referring to FIG. 7C, it is noted that the arms 36 have a colored portion or other suitable indicia portion indicated by the stippled region 60. As the memory card printed circuit board 16A engages the motherboard mounted backplane connector receptacle 14A, the engagement of the camming surfaces with the motherboard pivots the colored portions 60 towards the vertical portions 24 of the pair of triangular shaped projections 32, as shown in the non-fully engaged position in FIG. 7A. When the colored portions are no longer visible (because they are fully behind the vertical portions of the pair of triangular shaped projections) as shown in FIG. 7B, the memory card printed circuit board 16A is fully engaged in the motherboard mounted backplane connector receptacle 14A.

Figure 6B:
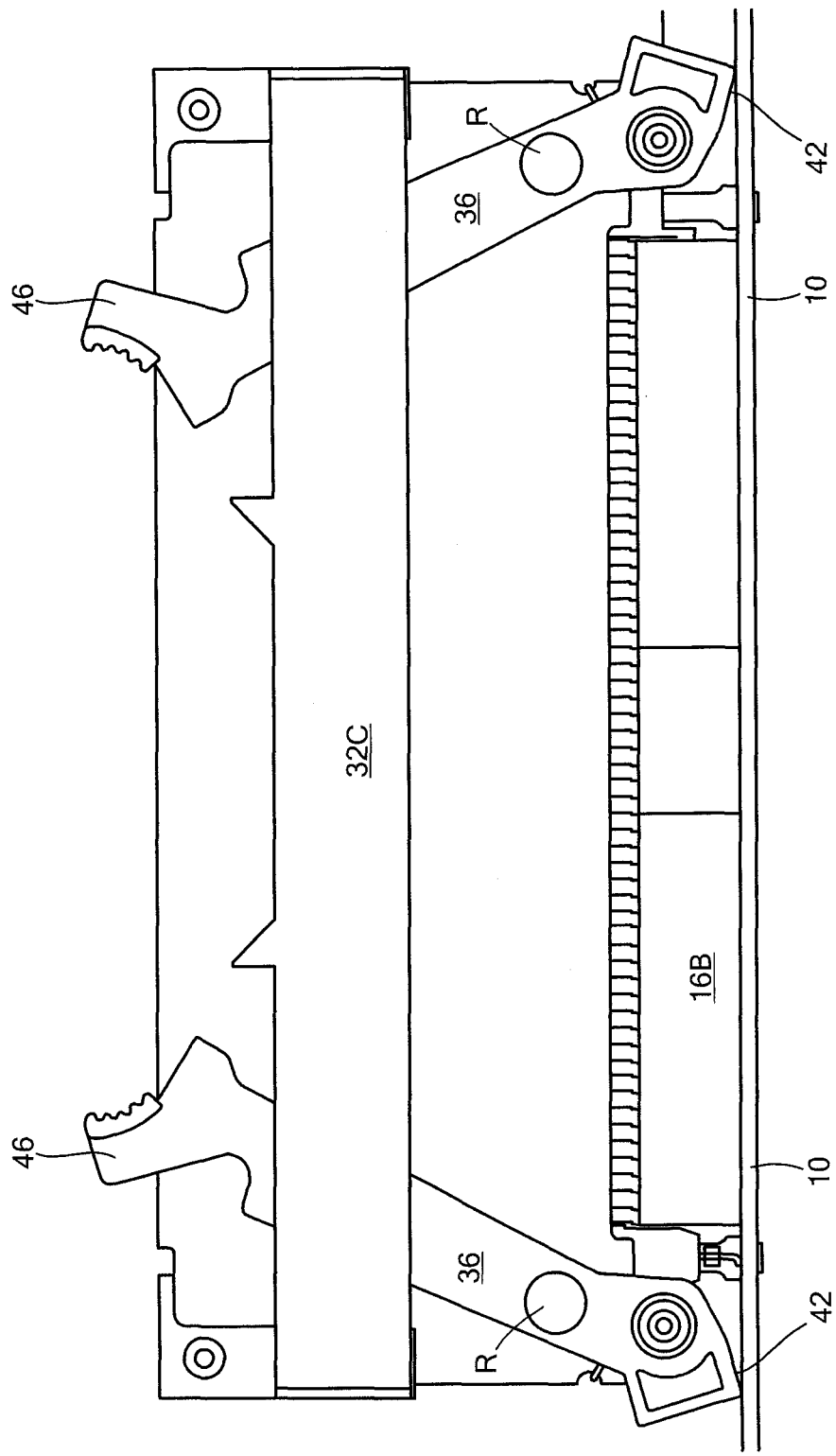
FIG. 6B is a rear view of the memory card printed circuit board of FIG. 2 partially removed from the motherboard in accordance with the disclosure.

To remove the memory card printed circuit board 16A from the motherboard mounted backplane connector receptacle 14A, the tabs 46 (FIG. 6) are engaged by the thumbs or finger. Thus, the proximal ends 44 of the arms engage the thumb or finger of a person (not shown) manually operating the injector/ejector mechanism 30 to spread the arms 36 in opposite rotatory directions about the pivot points 38 forcing the surface 42 of the camming structure 40 against the upper surface of the motherboard to vertically lift the printed circuit from then electrical connector receptacle 16A mounted to the motherboard. That is, the arms are forced apart so that the distal portions of the camming surface 42 of the camming member 40 are forced against the contacted surface of the motherboard 10 and thereby lift the memory card printed circuit board 16A vertically from the motherboard mounted backplane connector receptacle 14A as shown in FIG. 6B.

Figure 8:
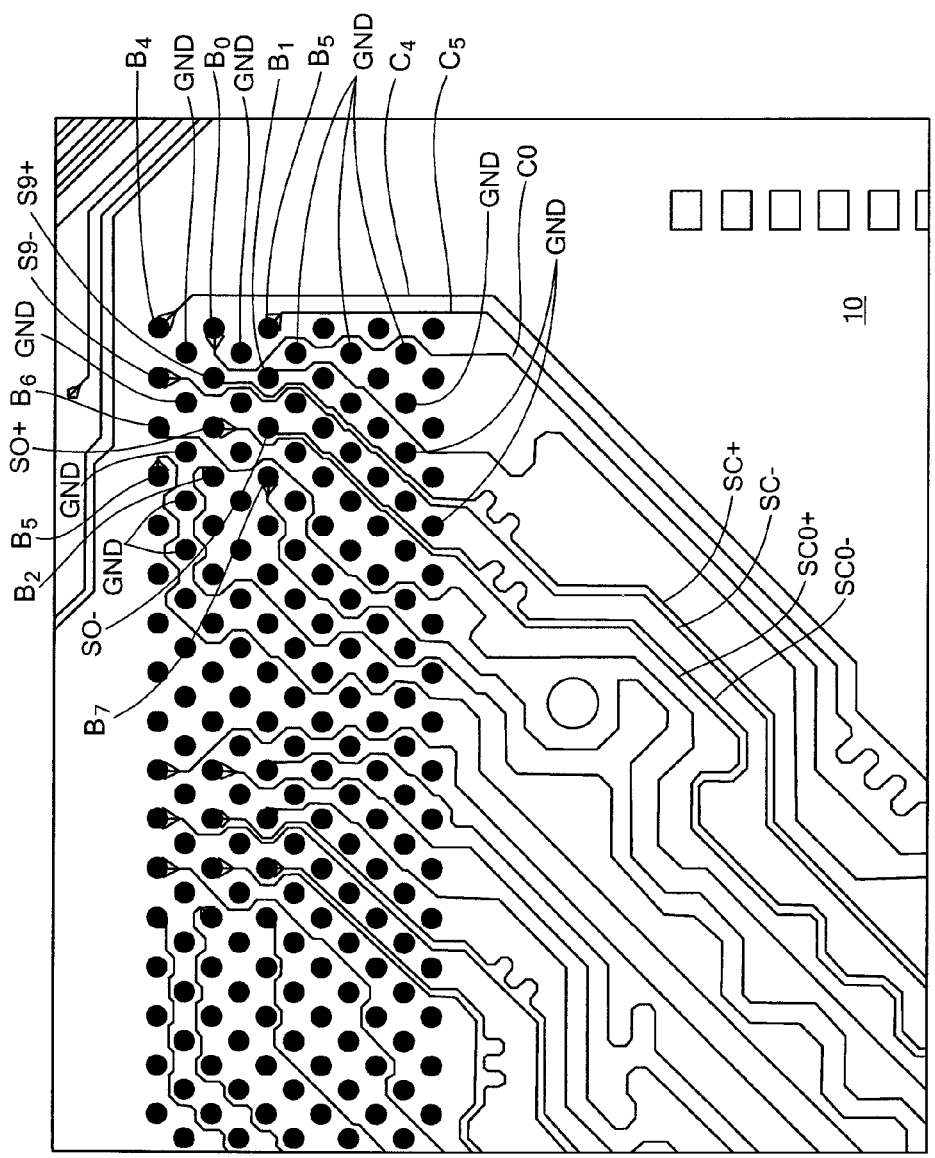
FIG. 8 is a top view of a wiring layout of conductors connecting the pins of the right angle backplane connector receptacle of FIG. 1 on a portion of the motherboard to the CPU in accordance with the disclosure.
Figure 8A:
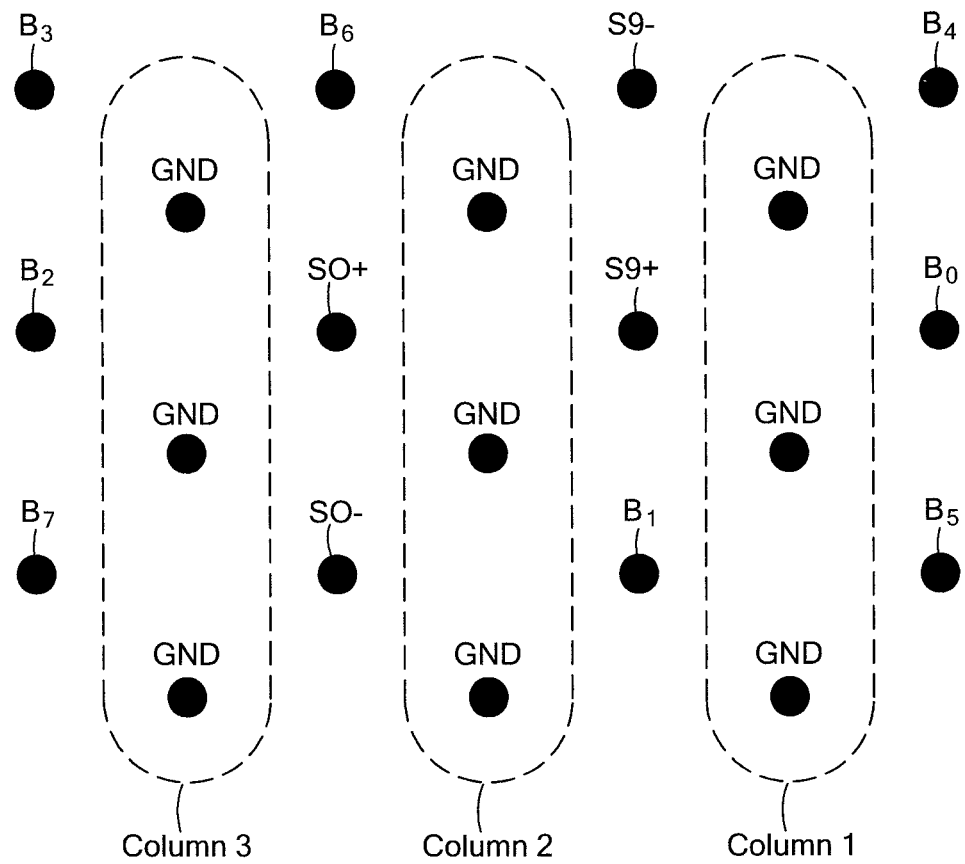
FIG. 8A shows the layout of the pins for one byte of the pins of FIG. 8 of the right angle backplane connector receptacle of FIG. 1.

Referring now to FIG. 8, the layout of the conductors connecting the pins of the right angle backplane connector receptacle 14A, 14B (FIG. 1) on a portion of the motherboard (FIG. 1) to the CPU is shown. FIG. 8A shows a more detailed layout representation of the pins for one byte. There are three columns of ground pins (GND) which will be electrically connected to the ground plates of the right angle backplane connectors, 22A-22D, referred to above. There are four columns of signal/strobe pins; the signal pins are labeled as B0-B7 for each of the eight bits in the byte and the strobe pins S0+, S0−, for a differential pair of strobe signals indication the start of the byte and strobe pins S9+, S9− for a differential pair of strobe signals indication the termination of the byte; see also FIG. 3 for an exemplary column of signal pins.

Thus, referring also to FIG. 8A, one columns has signal bits B4, B0 and B5; a second columns has a pair of strobe pins S9−, S9+, and signal bit B1; a third columns has signal pins B6, and a pair of strobe pins S0+, and S0−; and the fourth columns has signal pins B, B2 and B7. It is noted that a columns of ground pins GND separate the columns of signal/strobe pins. Thus:

COLUMN 1 (FIG. 8A) of ground pins separates the columns having signal bits B4, B0 and B5 from the columns having the pair of strobe pins S9−, S9+, and signal bit B1;

COLUMN 2 of ground pins separates the columns having the pair of strobe pins S9−, S9+, and signal bit B1 from the columns having bit B6 and strobe pins S0+ and S0; and COLUMN 3 of ground pins separates the columns having bit B6 and strobe pins S0+ and S0 from the columns having signal pins B3. B2 and B7.

Referring also to FIG. 8, it is noted that the conductors connected to signal pins B4 and B5 (i.e., conductors C4 and C5, respectively), which pins are separated vertically in the columns by pin B0, are routed on one side of the COLUMN 1 of ground pins while signal pin B0 is routed to the opposite side of the COLUMN of ground pins.

Thus, more generally stated: The signal pins in one of the columns have a first signal pin being disposed between a second signal pin and a third signal pin, wherein the motherboard routes the signal pins to the processor through conductors connected to the signal pins; and wherein portions of the conductors connected to the second signal pin and to the third pin are disposed adjacent one another on one side of the column of ground pins and the conductor connected to the first pin is on the other side of the column of ground pins.

It is also noted that the differential pair of strobe signals carried by pins S0+/S0_ and S9_/S0− are carried by conductors CS0+/CS_ and CS9_/CS0−, respectively; with conductors CS0+/CS0 passing side by side on the same side of the column of ground pins (here for example, the left side of COLUMN 2 of ground pins and likewise, with conductors CS9+/CS9 passing side by side on the same side of the column of ground pins (here for example, the left side of COLUMN 1 of ground pins.

Thus, more generally stated: The column of the pair of strobe pins being separated from the column of signal pins by a column of ground pins; wherein the motherboard routes the pair of strobe pins to the CPU through strobe pin conductors connected to the strobe pins, the pair of strobe pin conductors being disposed on the same side of the column of ground pins.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. An arrangement comprising: a motherboard;
   a processor electrically to, and mounted on, a portion of a surface of the motherboard;
   a memory card printed circuit board;
   a plurality of memory cards plugged into memory board slot type connectors on a surface of the memory card printed circuit board with the surface of the memory card printed circuit board being perpendicular to the surface of the motherboard;
   a right angle backplane connector having: a first end disposed perpendicular to, and electrically connected to the surface of the motherboard arid a second end disposed on the surface of, and electrically connected, to, the memory card printed circuit board
   wherein the plurality of memory cards are enabled to be suspended by the memory card printed circuit board over portions of the processor while the memory card printed circuit board maintains a position next to the processor;
   a heat sink having a base portion disposed over the processor wherein a portion of the heat sink is removed to conform with a shape of the plurality of memory cards.

2. An arrangement comprising:
   a motherboard;
   a processor electrically to, and mounted on, a portion of a surface of the motherboard;
   a memory card printed circuit board;
   a plurality of memory board slot type connectors arranged in rows and mounted on, and electrically connected to, a surface of the memory card printed circuit board;
   a plurality of memory cards, each one being plugged into a corresponding one of the plurality of memory board slot type connectors;
   a right angle backplane connector having;
      a first end disposed perpendicular to the surface of the motherboard, the first end being electrically to, and mounted vertically on, a different portion of a surface of the motherboard; and
      a second end, disposed at right angles to the first end and disposed on the surface of, and electrically connected to, the memory card printed circuit board;
      wherein the surface of the memory card printed circuit board is perpendicular to the surface of the motherboard and the plurality of memory cards is parallel to the surface of the motherboard;
      wherein the plurality of memory cards are enabled to be suspended by the memory card printed circuit board over portions of the processor while the memory card printed circuit board maintains a position next to the processor;
      a heat sink having a base portion disposed over the processor and having a vertical portion disposed between the distal ends of the first-mention memory card and the distal ends of the second memory cards.

3. The arrangement recited in claim 2 wherein the right angle backplane connector comprises:
electrical wires connected to the memory cards through the memory card printed circuit board and the plurality of memory board slot type connectors, each one being plugged into a corresponding one of plurality of memory board slot type connectors.

4. The arrangement recited in claim 2 including:
a second a memory card printed circuit board;
a second plurality of memory board slot type connectors arranged in rows and mounted on, and electrically connected to, a surface of the second memory card printed circuit board;
a second plurality of memory cards, each one being plugged into a corresponding one of the second plurality of memory board slot type connectors;
a second right angle backplane connector having:
  a first end disposed perpendicular to the surface of the motherboard, the first end being electrically to, and mounted vertically on, a second different portion of a surface of the motherboard; and
  a second end, disposed at a right angles to the first end of the second right angle backplane connector and disposed on the surface of, and electrically connected to, the memory card printed circuit board;
wherein the surface of the second memory card printed circuit board is perpendicular to the surface of the motherboard and the plurality of memory cards is parallel to the surface of the motherboard; and
wherein the first-mention memory card printed circuit board and the second the memory card printed circuit board are on opposite sides of the processor.

5. The arrangement recited in claim 4 wherein the second plurality of memory cards are suspended by the second memory card printed circuit board over portions of the processor while the second memory card printed circuit board maintains a position next to the processor.

6. The arrangement recited in claim 5 wherein the first-mention memory card printed circuit board and the second the memory card printed circuit board are on opposite sides of the processor.

7. The arrangement recited in claim 6 wherein the first-mention memory cards have distal ends projecting towards distal ends of the second memory cards.

8. The arrangement recited in claim 2 wherein the first end of the a right angle backplane connector has a column of signal pins separated by a column of ground pins; the signal pins in one of the columns have a first signal pin being disposed between a second signal pin and a third signal pin, wherein the motherboard routes the signal pins to the processor through conductors connected to the signal pins; and wherein portions of the conductors connected to the second signal pin and to the third pin are disposed adjacent one another on one side of the column of ground pins and the conductor connected to the first pin is on the other side of the column of ground pins.

9. The arrangement recited in claim 2 wherein the first end of the a right angle backplane connector has a pair strobe pins; the column of the pair of strobe pins being separated from the column of signal pins by a second column of ground pins; wherein the motherboard routes the pair of strobe pins to the CPU through strobe pin conductors connected to the strobe pins, the pair of strobe pin conductors being disposed on the same side of the second column of ground pins.

\* \* \* \* \*